US008610630B2

(12) United States Patent
Yun

(10) Patent No.: US 8,610,630 B2
(45) Date of Patent: Dec. 17, 2013

(54) 4-PORT STRIP LINE CELL FOR GENERATING STANDARD NEAR FIELDS

(75) Inventor: Je Hoon Yun, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 100 days.

(21) Appl. No.: 13/296,256

(22) Filed: Nov. 15, 2011

(65) Prior Publication Data

US 2012/0161899 A1 Jun. 28, 2012

(30) Foreign Application Priority Data

Dec. 23, 2010 (KR) ........................ 10-2010-0134058

(51) Int. Cl.
*G01R 29/10* (2006.01)
*G01R 27/26* (2006.01)

(52) U.S. Cl.
USPC ............................ 343/703; 324/627; 324/629

(58) Field of Classification Search
USPC ........... 324/627, 629, 601, 641, 642; 343/703
See application file for complete search history.

(56) References Cited

U.S. PATENT DOCUMENTS 4,605,916 A 8/1986 Tehori
4,837,581 A 6/1989 Hansen et al.
5,910,729 A * 6/1999 Yun .............................. 324/627

FOREIGN PATENT DOCUMENTS

JP 04-175667 A 6/1992
KR 100137576 B1 2/1998

OTHER PUBLICATIONS

J. D. Gavenda et al., "A Strip-Line TEM Cell for Measuring Electromagnetic Emissions", IEEE 1991 International Symposium on Electromagnetic Compatibility, Symposium Record, pp. 17-18, Aug. 12-16, 1991.

Myron L. Crawford et al., "Generation of EM Susceptibility Test Fields Using a Large Absorber-Loaded TEM Cell", IEEE Transactions on Instrumentation and Measurement, vol. IM-26, No. 3, pp. 225-230, Sep. 1997.

* cited by examiner

*Primary Examiner* — Hoang V Nguyen
(74) *Attorney, Agent, or Firm* — Rabin & Berdo, P.C.

(57) ABSTRACT

A 4-port strip line cell for generating standard near fields includes an upper conductor, a third port, a first port, a lower conductor, a second port and a fourth port. The third port supplies a power signal to the upper conductor. The first port terminates the upper conductor. The lower conductor is disposed to be spaced apart from the upper conductor. The second port is connected to the lower conductor so as to supply a power signal in the opposite direction of the third port. The fourth port terminates the lower conductor.

13 Claims, 12 Drawing Sheets

(a)

(b)

(a)

(b)

(a)

(b)

(a)

(b)

(a)

(b)

(a)

(b)

4-PORT STRIP LINE CELL FOR GENERATING STANDARD NEAR FIELDS

CROSS-REFERENCES TO RELATED APPLICATIONS

The present application claims priority under 35 U.S.C 119(a) to Korean Application No. 10-2010-0134058, filed on Dec. 23, 2010, in the Korean Intellectual Property Office, which is incorporated herein by reference in its entirety set forth in full.

BACKGROUND

Exemplary embodiments of the present invention relate to a strip line cell, and more particularly, to a 4-port strip line cell for generating standard near fields for dominant electric or magnetic fields.

Existing transverse electromagnetic (TEM) lines are classified into one-port TEM lines each having input/output ports formed at one side thereof, such as a GTEM cell, a WTEM cell, a TTEM cell and an improved GTEM cell, and two-port TEM lines each having input/output ports formed at both sides thereof, such as a Crawford TEM cell (referred to as a symmetric TEM cell), an asymmetric TEM cell, a TEM for automatic measurement, a 6-port TEM cell and a strip line cell. These one- and two-port TEM lines are all used for measurement of unwanted electromagnetic waves, measurement of electromagnetic susceptibility, antenna correction, and the like. However, the one-port TEM lines support only a test for near fields, and the two-port TEM lines support not only a test for near fields but also a test for far fields. Therefore, it can be considered that the one- and two-port TEM lines are different from each other.

The two-port TEM lines may be divided into two kinds of two-port TEM lines, i.e., a waveguide cell such as a TEM cell, an asymmetric TEM cell, a TEM cell for automatic measurement or a circular TEM cell, and a strip line cell such as a straight strip line cell or a curved strip line cell. The waveguide cell generates standard electromagnetic waves by mounting an internal conductor in the inside of an external conductor and making a potential difference between the internal and external conductors. The strip line cell generates standard electromagnetic waves by mounting two flat strip lines to be exposed to the outside without being divided into external and internal conductors and making a potential difference between the two flat strip lines.

Since the internal conductor is isolated from the outside by the sealed external conductor, the waveguide cell does not have influence on external noises or is not influenced by the external noises. However, the waveguide cell should use even a first resonance frequency as a frequency used, due to the occurrence of a resonance frequency with a high Q-factor.

On the other hand, since the standard electromagnetic waves are directly generated at the outside, the strip line cell has influence on external noises or is influenced by the external noises. However, since a resonance frequency with a low Q-factor may occur due to the opened structure, the strip line cell can obtain a broadband of a frequency used.

Thus, the waveguide cell can be used in a general experiment space, but the strip line cell is recommended to be used in a sealed space such as a shielding body or chamber. In the waveguide cell, it is highly likely that the size of an object to be tested is restricted due to the sealed external conductor. On the other hand, in the strip line cell, the object to be tested is restricted by only the height between the two flat strip lines, and thus it is possible to perform measurement up to a relatively large object to be tested. In the waveguide cell, the band of a frequency used is restricted due to the occurrence of a resonance frequency with a high Q-factor. However, in the strip line cell, the two flat strip lines are exposed to the outside, and thus the band of a frequency used is further broadened thank to the occurrence of a resonance frequency with a low Q-factor.

The technical configuration described above is a background art for better understanding of the present invention, but is not a prior art well-known in the technical field pertinent to the present invention.

SUMMARY

The conventional strip line has a two-port structure having one input port and one output port, respectively formed at both sides thereof. Therefore, in a case where the conventional strip line generates standard near fields like the existing Crawford TEM cell, the standard near fields are distorted due to occurrence of a circulating wave. To solve such a problem, an attenuator may be used. However, in this case, the utilization of electric power is considerably lowered, and therefore, it is not suitable to generate highly dominant electric and magnetic fields.

In the conventional strip line cell, the standard near fields are distorted due to corner waves generated by bending of taper areas respectively positioned at both ends of the conventional strip line cell. That is, in the conventional strip line cell, a resonance frequency with a relatively high Q-factor occurs due to the corner waves, and therefore, the occurrence of uniform electromagnetic waves is obstructed.

Due to such a problem, it is difficult to implement a high frequency used and generate standard near fields for dominant electric and magnetic fields with a high intensity. As a result, the conventional strip line cell cannot be used as a susceptibility testing device for standard near fields.

An embodiment of the present invention relates to a 4-port strip line cell for generating standard near fields, which can be applied to susceptibility tests of objects to be tested, interference and correction estimation of radio devices for the standard near fields by preventing occurrence of circulating waves and reducing the amount of corner waves.

In one embodiment, a 4-port strip line cell for generating standard near fields includes an upper conductor, a third port configured to supply a power signal to the upper conductor, a first port configured to terminate the upper conductor, a lower conductor disposed to be spaced apart from the upper conductor, a second port configured to be connected to the lower conductor and to supply a power signal in the opposite direction of the third port, and a fourth port configured to terminate the lower conductor.

The upper conductor may include a first outer conductor configured to be formed in a flat plate shape and to have a first opening through which the first outer conductor is penetrated, and a first inner conductor formed in a flat plate shape and disposed horizontal to the first outer conductor in the inside of the first opening.

The third port may have a third connector internal core and a third connector external covering, and the first port may have a first connector internal core and a first connector external covering. The third and first connector internal cores may be connected to both ends of the first inner conductor, respectively, and the third and first connector external coverings may be connected to both ends of the first outer conductor, respectively.

The first inner conductor and the first outer conductor may be formed to have uniform characteristic impedances.

The lower conductor may include a second outer conductor configured to be formed in a flat plate shape and to have a second opening through which the second outer conductor is penetrated, and a second inner conductor formed in a flat plate shape and disposed horizontal to the second outer conductor in the inside of the second opening.

The second port may have a second connector internal core and a second connector external covering, and the fourth port may have a fourth connector internal core and a fourth connector external covering. The second and fourth connector internal cores may be connected to both ends of the second inner conductor, respectively, and the second and fourth connector external coverings may be connected to both ends of the second outer conductor, respectively.

The second inner conductor and the second outer conductor may be formed to have uniform characteristic impedances.

The distance between the upper and lower conductors may be set to a distance at which the maximum uniformity is formed.

Both sides of each of the first and second inner conductors may be formed to have taper structures.

The taper structures may be formed in a straight line shape.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
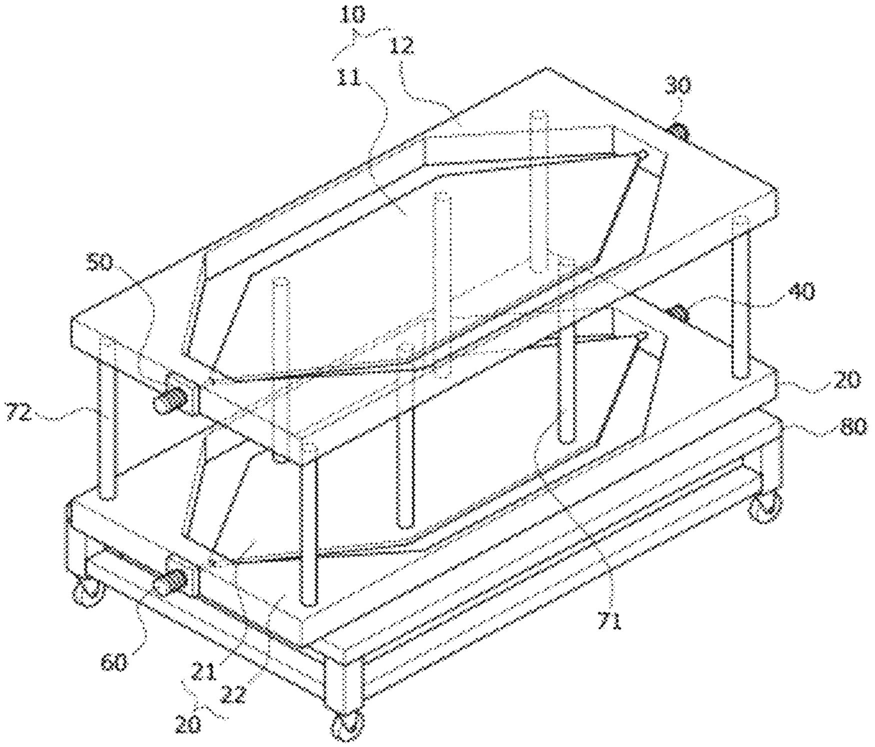
FIG. 1 is a perspective view of a 4-port strip line cell for generating standard near fields according to an embodiment of the present invention.
Figure 2:
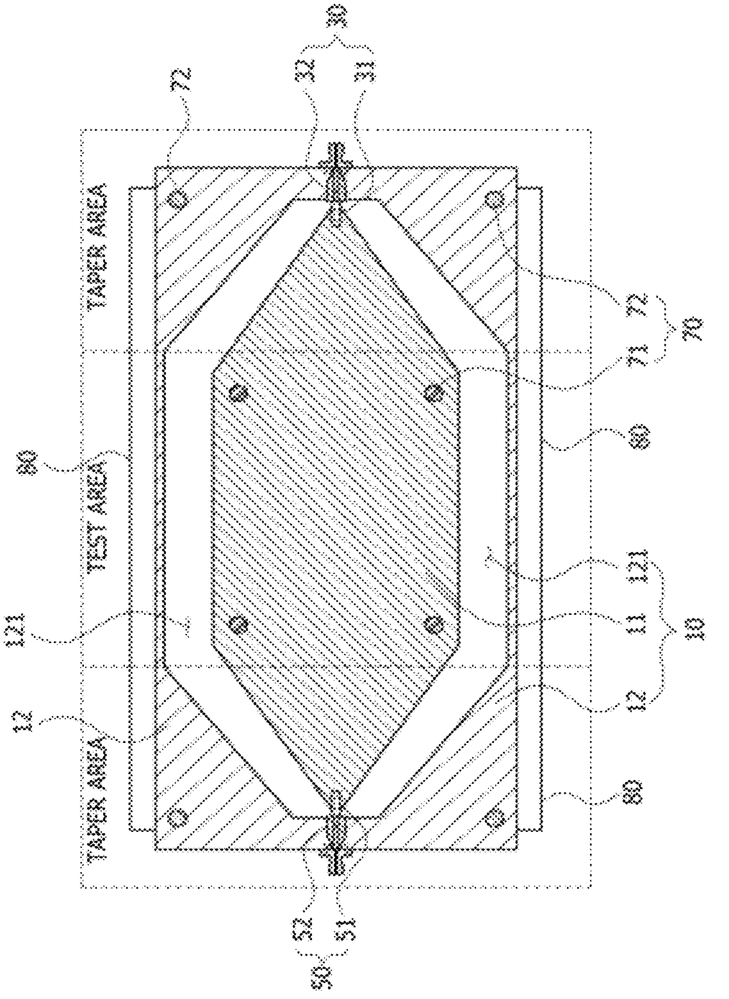
FIG. 2 is a plan cross-sectional view of the 4-port strip line cell according to the embodiment of the present invention.
Figure 3:
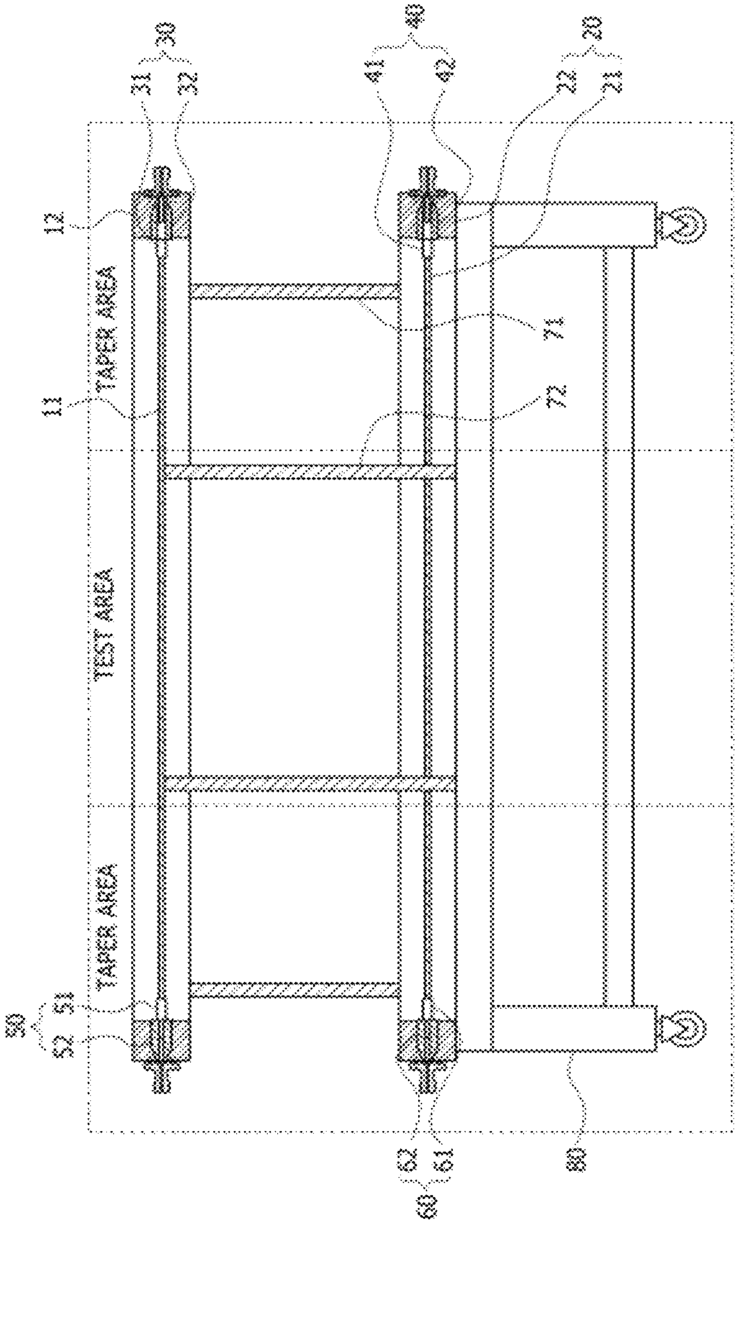
FIG. 3 is a front sectional view of the 4-port strip line cell according to the embodiment of the present invention.
Figure 4:
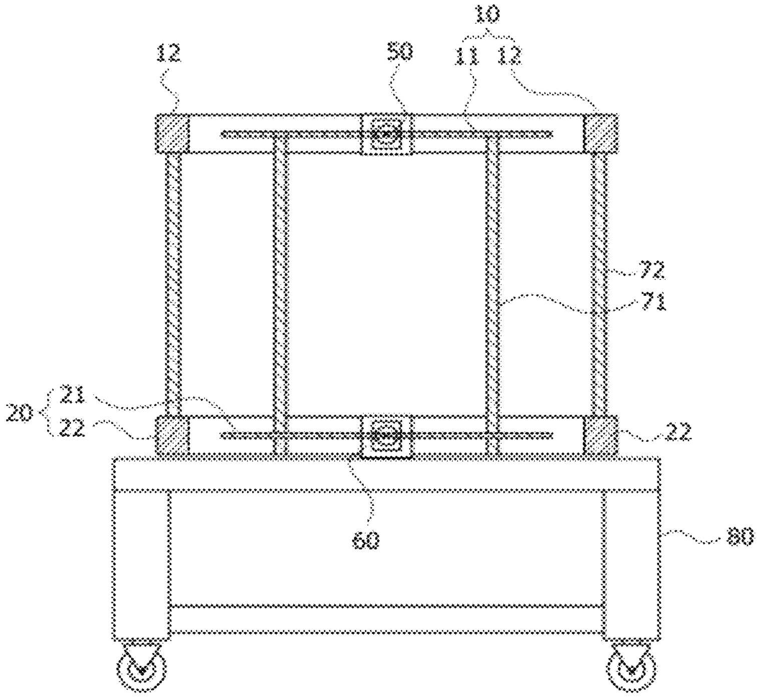
FIG. 4 is a side sectional view of the 4-port strip line cell according to the embodiment of the present invention.
Figure 5:
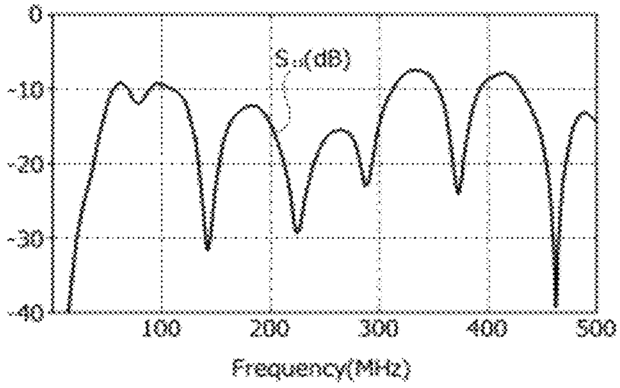
FIG. 5 is a graph illustrating an S11 parameter characteristic of the 4-port strip line cell according to the embodiment of the present invention.
Figure 6:
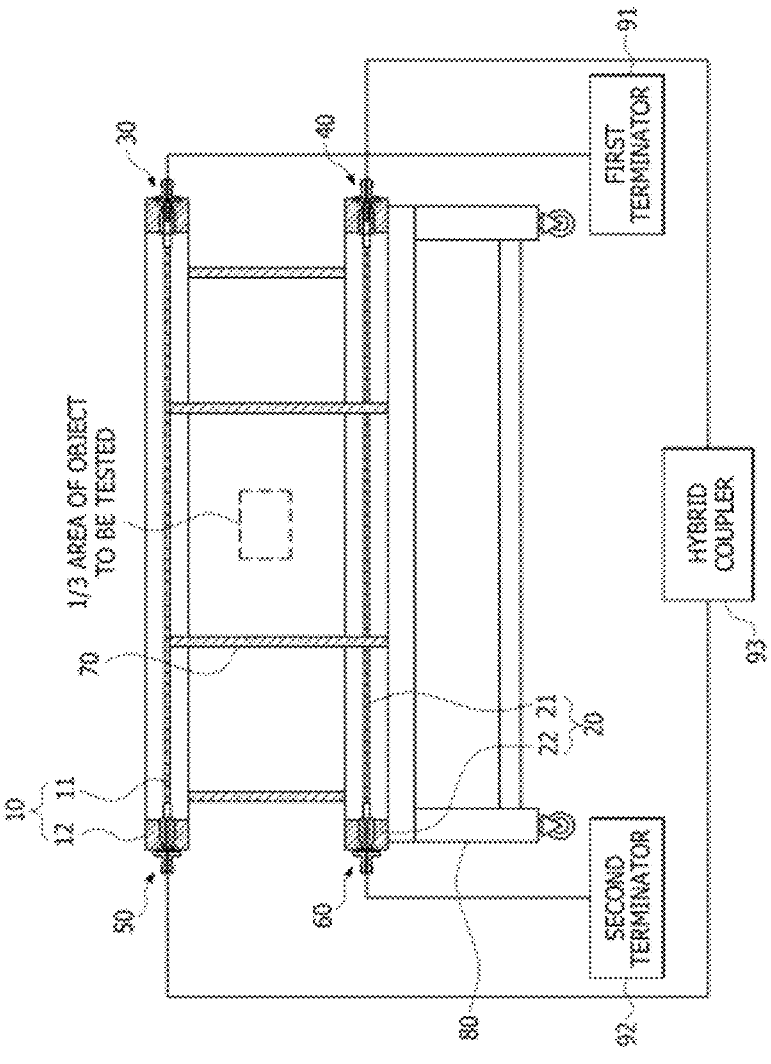
FIG. 6 is a block configuration diagram of a system for generating dominant electric/magnetic fields according to the embodiment of the present invention.

FIG. 1 is a perspective view of a 4-port strip line cell for generating standard near fields according to an embodiment of the present invention. FIG. 2 is a plan cross-sectional view of the 4-port strip line cell according to the embodiment of the present invention. FIG. 3 is a front sectional view of the 4-port strip line cell according to the embodiment of the present invention. FIG. 4 is a side sectional view of the 4-port strip line cell according to the embodiment of the present invention. FIG. 5 is a graph illustrating an S11 parameter characteristic of the 4-port strip line cell according to the embodiment of the present invention. FIG. 6 is a block configuration diagram of a system for generating dominant electric/magnetic fields according to the embodiment of the present invention.

The 4-port strip line cell according to the embodiment of the present invention includes an upper conductor 10, a lower conductor 20 and first to fourth ports 30, 40, 50 and 60.

The upper and lower conductors are disposed to be vertically spaced apart from each other, so as to form a space in which an object to be tested can be positioned between these conductors.

The first to fourth ports 30, 40, 50 and 60 are provided to apply and output power signals to the respective upper and lower conductors 10 and 20. The third port 50 is mounted to one side of the upper conductor 10, and the first port 30 is mounted to the other side of the upper conductor 10. The second port 40 is mounted to one side of the lower conductor 20, and the fourth port 60 is mounted to the other side of the lower conductor 20. In this case, the directions of the power signals respectively inputted to the upper and lower conductors 10 and 20 through the third and second ports 50 and 40 are opposite to each other.

Meanwhile, a support platform 80 for supporting the lower conductor 20 may be provided beneath the lower conductor 20.

A first terminator 91 for terminating the upper conductor 10 is connected to the first port 30, and a second terminator 92 for terminating the lower conductor 20 is connected to the fourth port 60.

For reference, it has been illustrated in this embodiment that the power signal of the upper conductor 10 is supplied through the third port 50 and outputted through the first port 30, and the power signal of the lower conductor 20 is supplied through the second port 40 and outputted through the fourth port 60.

However, the technical scope of the present invention is not limited thereto, and may be configured using various input/output methods.

The 4-port strip line cell further includes a hybrid coupler 93 to apply power signals for generating standard near fields between the upper and lower conductors 10 and 20.

For reference, a test area in which the object to be tested is placed and taper areas for connecting the test area to the first to fourth ports 30, 40, 50 and 60 are used in the specification for better understanding.

The upper conductor 10 has a first inner conductor 11 formed in a flat plate shape and a first outer conductor 12. The first outer conductor 12 is made of a conductor such as aluminum or copper.

The first outer conductor 12 has a first opening 121 formed in a flat plate shape so that the first outer conductor 12 is vertically penetrated through the first opening 121. The first inner conductor 11 is disposed horizontal to the first outer conductor 12 in the inside of the first opening 121.

The lower conductor 20 has a second inner conductor 21 formed in a flat plate shape and a second outer conductor 22. The second outer conductor 22 is made of a conductor such as aluminum or copper. The second outer conductor 22 has a second opening 221 formed in a flat plate shape so that the second outer conductor 22 is vertically penetrated through the second opening 221. The second inner conductor 21 is disposed horizontal to the second outer conductor 22 in the inside of the second opening 221.

A support 70 is formed of a non-conductor such as Teflon or plastic, and supports the upper conductor 10 so that the object to be tested is positioned between the upper and lower conductors 10 and 20 while maintaining a distance between the upper and lower conductors 10 and 20. The support 70 has first supports 71 for supporting the first inner conductor 11 and second supports 72 for supporting the first outer conductor 12.

The first supports 71 support the first inner conductor 11 at four positions, and the second supports 72 support the first outer conductor 12 at four positions. The first and second supports 71 and 72 may be mounted at various positions including corners and the like.

In the first to fourth ports 30, 40, 50 and 60, the third and first ports 50 and 30 are symmetrically mounted at both left and right ends of the upper conductor 10, and the second and fourth ports 40 and 60 are symmetrically mounted at both left and right ends of the lower conductor 20.

The third and first ports 50 and 30 are connected the first inner conductor 11 and the first outer conductor 12 of the upper conductor 10, respectively, and the second and fourth ports 40 and 60 are connected to the second inner conductor 21 and the second outer conductor 22 of the lower conductor 20, respectively. Each of the first to fourth ports 30, 40, 50 and 60 has a connector internal core connected to the inner conductor and a connector external covering connected to the outer conductor.

That is, a first connector internal core 31 is connected to the first inner conductor 11 at the right side of the first inner conductor 11, and a third connector internal core 51 is connected to the first inner conductor 11 at the right side of the first inner conductor 11. A second connector internal core 41 is connected to the second inner conductor 21 at the right side of the second inner conductor 21, and a fourth connector internal core 61 is connected to the second inner conductor 21 and the left side of the second inner conductor 21.

A first connector external covering 32 is connected to the first outer conductor 12 at the right side of the first outer conductor 12, and a third connector external covering 52 is connected to the first outer conductor 12 at the left side of the first outer conductor 12. A second connector external covering 42 is connected to the second outer conductor 22 at the right side of the second outer conductor 22, and a fourth connector external covering 62 is connected to the second outer conductor 22 at the left side of the second outer conductor 22.

As described above, the 4-port strip line cell according to the embodiment of the present invention has four ports composed of the first to fourth ports 30, 40, 50 and 60, thereby solving a fundamental problem that the conventional strip line cell has difficulty in generating standard near fields due to the generation of circulating waves.

In a case where the third port 50 is set as an input port for supplying the power signal in the connection relation of the first to fourth ports 30, 40, 50 and 60, the first port 30 is connected to the first terminator 91 to terminate the first port 30. In a case where the second port 40 is set as an input port for supplying the power signal in the connection relation of the first to fourth ports 30, 40, 50 and 60, the fourth port 60 is connected to the second terminator 92 to terminate the fourth port 60.

That is, the first and fourth ports 30 and 60 are connected to the first and second terminators 91 and 92, respectively, so that the power signals respectively inputted through the first and fourth ports 30 and 60 do not form a closed circuit. Hence, it is possible to prevent the formation of a circulating wave that returns to the test area.

The taper areas of the upper and lower conductors 10 and 20 are formed in a straight line shape so that the generation of corner waves in the taper areas can be minimized.

The structure and principle of the 4-port strip line cell will be described in detail as follows.

The sectional structure of the test area is formed by estimating structural variables so that characteristic impedances between the first and second outer conductors 12 and 22 and the first and second inner conductors 11 and 21 are uniform (typically, 50 or 75Ω) for the purpose of impedance matching.

In the test area, it is possible to measure electromagnetic interference and susceptibility with respect to various objects to be tested through the maximum security of a uniform field area (⅓ area of an object to be tested) in which the object to be tested is positioned.

The maximum field uniformity is provided so that standard electromagnetic waves with excellent quality can be generated in the ⅓ area of the object to be tested.

In the side sectional view illustrated in FIG. 4, a wide uniform field area can be secured as the first inner conductor 11 and the second inner conductor 21 are distant from each other in a vertical direction, but the field uniformity of electromagnetic waves may be deteriorated. Thus, the distance between the first and second inner conductors 11 and 21 is set to a distance at which the maximum field uniformity can be obtained.

Meanwhile, in the taper areas, the first and second inner conductors 11 and 21 in the test area are connected to the first to fourth connector internal cores 31, 41, 51 and 61, and the first and second outer conductors 12 and 22 are connected to the first to fourth connector external coverings 32, 42, 52 and 62. Thus, the taper areas are formed in a taper structure for the purpose of impedance matching.

The taper areas are configured to minimize the amount of reflection waves by matching the characteristic impedances between the first and second outer conductors 12 and 22 and the first and second inner conductors 11 and 21 to characteristic impedances of the first to fourth ports 30, 40, 50 and 60 in the section of the test area. In this case, the taper areas are designed so that the characteristic impedances are matched.

FIG. 5 illustrates an example of the design of the 4-port strip line cell available up to 300 MHz, and a characteristic of a parameter S11 is illustrated in FIG. 5.

In FIG. 5, it can be seen that the impedance matching less than −9 dB is well implemented up to 300 MHz. Also, it can be seen that S-parameter characteristics according to changes in frequency are smoothly connected due to a low Q-factor. For reference, the 4-port strip line cell is designed so that the distance between the first and second inner conductors 11 and 21 is 75 cm, the width of each of the first and second inner conductors 11 and 21 is 75 cm, the entire length of each of the first and second inner conductors 11 and 21 is 150 cm, and the length of the test area is 75 cm.

Through such a design, the 4-port strip line cell can be used in interference estimation of a typical mobile phone for receiving digital multimedia broadcasting (DMB) or susceptibility test for near fields. If it is assumed that the ⅓ area of the distance between the first and second inner conductors 11 and 21 is a ⅓ area of an object to be tested, the size of the object to be tested can be accepted up to 25 cm.

Thus, it can be seen that the frequency band used is extended two or more times than that of a TEM line (Crawford TEM cell or coupled transmission line cell) that can secure the ⅓ area of the object to be tested.

In the test area of the 4-port strip line cell according to the embodiment of the present invention, the coupled transmission line cell shown in FIG. 6, e.g., the principle that power signals are generated in the hybrid coupler 93 or the like, is used to generate dominant electric fields or dominant magnetic fields.

For reference, although it has been illustrated in the specification that the hybrid coupler 93 is used as an example of the coupled transmission line cell, it will be apparent by those skilled in the art that an additional coupled transmission line cell may be further provided to generate power signals. Further, the coupled transmission line cell can be readily implemented by those skilled in the art, and therefore, its detailed description will be omitted.

Referring to FIG. 6, the second and third ports 40 and 50 are set as input ports, and the first and fourth ports 30 and 60 are terminated using the first and second terminators 91 and 92, respectively. If power signals having a phase difference of 180° and the same amplitude are applied to the respective second and third ports 40 and 50 through the hybrid coupler 93, the magnetic fields are offset and the electric fields are overlapped in the center of the test area, thereby generating dominant electric fields.

For reference, the length of the transmission line from the hybrid coupler 93 to the third port 50 is identical to that of the transmission line from the hybrid coupler 93 to the second port 40.

If power signals having a phase difference of 0° and the same amplitude are applied to the respective second and third ports 40 and 50, the electric fields are offset and the magnetic fields are overlapped in the center of the test area, thereby generating dominant magnetic fields.

Figure 7:
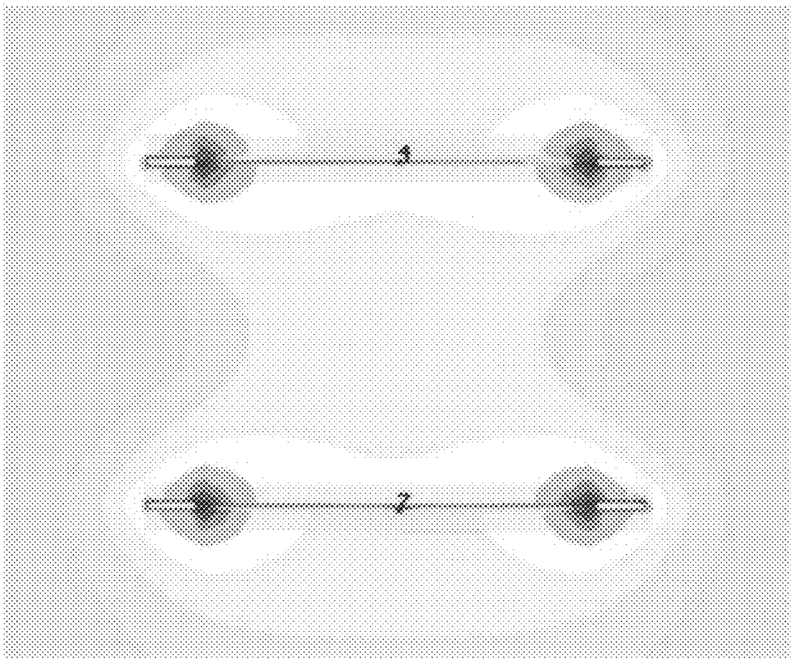
FIGS. 7(*a*) and 7(*b*) illustrate distributions of electric and magnetic fields on a side section of the 4-port strip line cell due to the generation of dominant electric fields according to the embodiment of the present invention.
Figure 7:
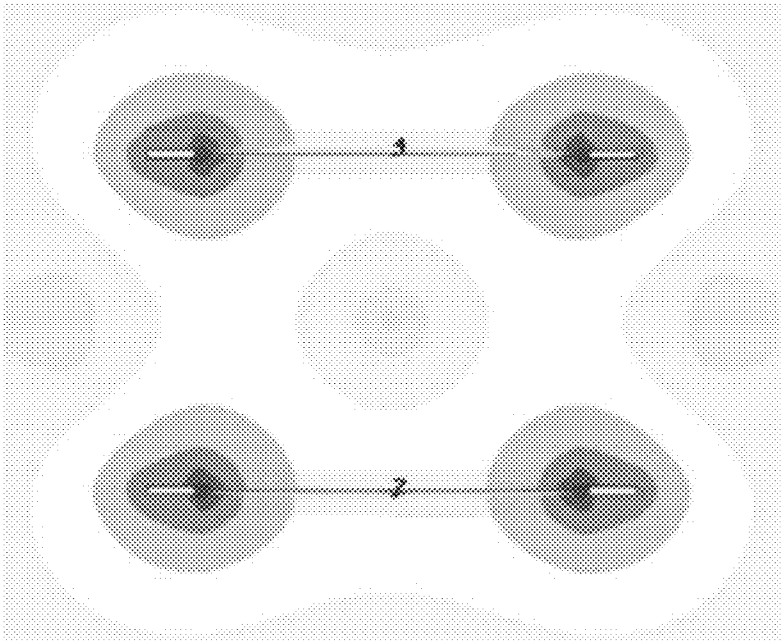
Figure 8:
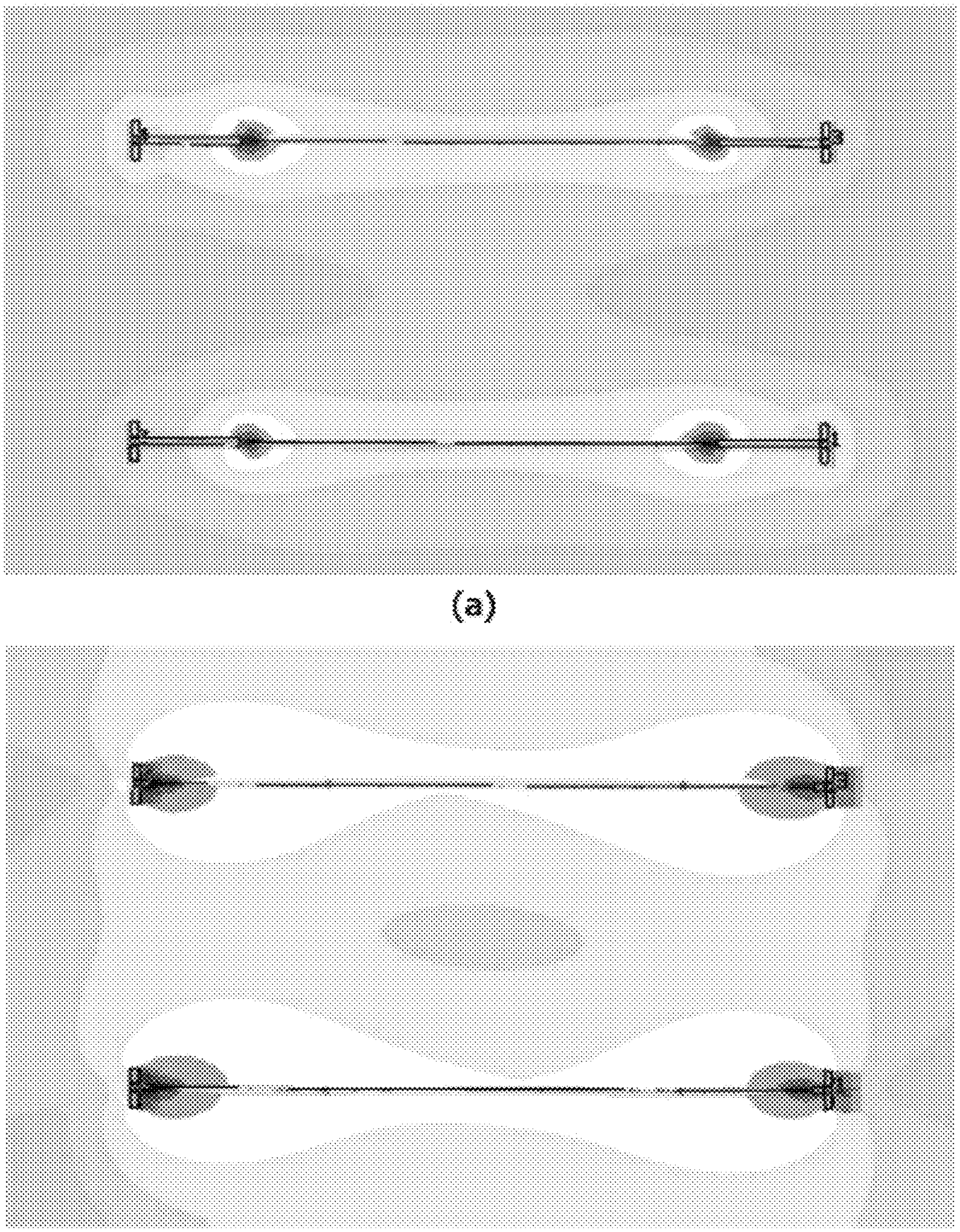
FIGS. 8(*a*) and 8(*b*) illustrate distributions of electric and magnetic fields on a front section of the 4-port strip line cell due to the generation of dominant electric fields according to the embodiment of the present invention.
Figure 9:
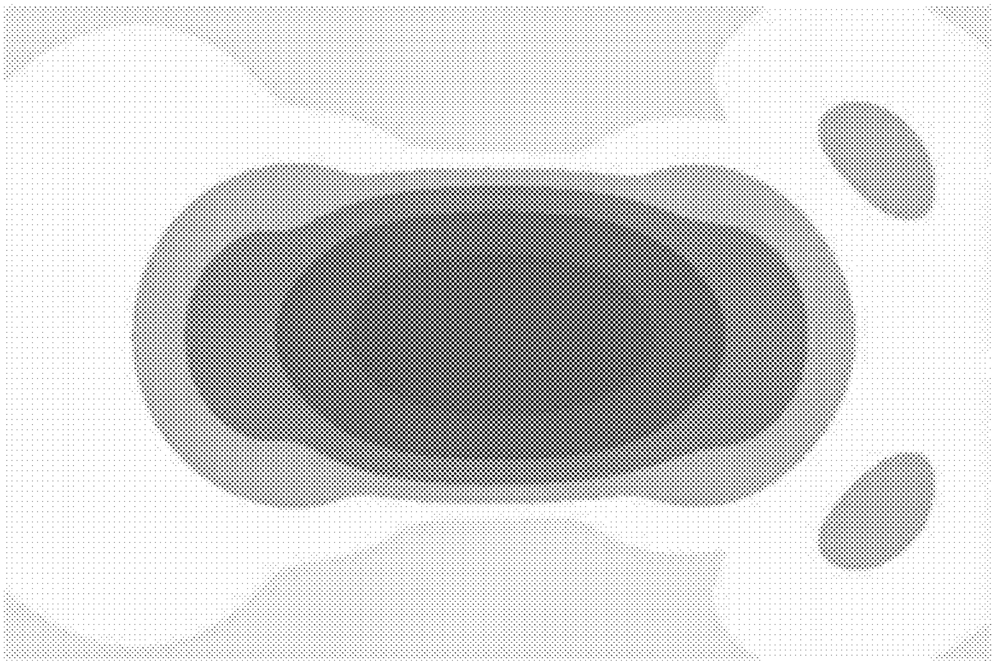
FIGS. 9(*a*) and 9(*b*) illustrate distributions of electric and magnetic fields on a plan section of the 4-port strip line cell due to the generation of dominant electric fields according to the embodiment of the present invention.
Figure 9:
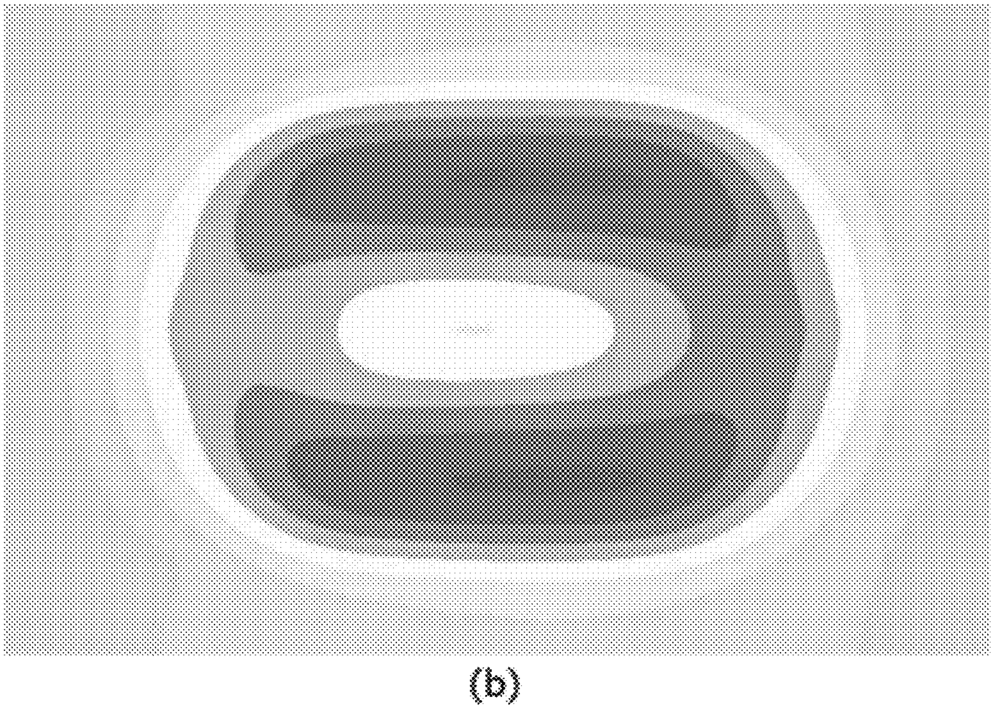

FIG. 7 illustrates distributions of electric and magnetic fields on a side section of the 4-port strip line cell due to the generation of dominant electric fields according to the embodiment of the present invention. FIG. 8 illustrates distributions of electric and magnetic fields on a front section of the 4-port strip line cell due to the generation of dominant electric fields according to the embodiment of the present invention. FIG. 9 illustrates distributions of electric and magnetic fields on a plan section of the 4-port strip line cell due to the generation of dominant electric fields according to the embodiment of the present invention.

First, the intensity (V/m) of electric fields and the intensity (V/m) of magnetic fields in the center of the test area are shown in the following Tables 1 and 2.

TABLE 1

| Intensity (V/m) of electric fields at center of test area | | | | | | |
|---|---|---|---|---|---|---|
| | Frequency (MHz) | | | | | |
| | 50 | 100 | 150 | 200 | 250 | 300 |
| Ex | 0 | 0 | 0 | 0 | 0 | 0 |
| Ey | 10.5 | 11.9 | 14.3 | 12.3 | 14.8 | 8.8 |
| Ez | 0.01 | 2.3 | 4.2 | 7.9 | 7.9 | 16.3 |

TABLE 2

| Intensity (V/m) of magnetic fields at center of test area | | | | | | |
|---|---|---|---|---|---|---|
| | Frequency (MHz) | | | | | |
| | 50 | 100 | 150 | 200 | 250 | 300 |
| Hx | 0.001 | 0.002 | 0.003 | 0.004 | 0.009 | 0.003 |
| Hy | 0.0001 | 0.0004 | 0.0004 | 0.0006 | 0.0006 | 0.002 |
| Hz | 0 | 0 | 0 | 0 | 0.0004 | 0.00015 |

If it is assumed that the 4-port strip line cell according to the embodiment of the present invention is available up to 300 MHz in Tables 1 and 2, Tables 1 and 2 show intensities of electric and magnetic fields generated at the center of the test area according to each of the frequencies when the dominant electric fields are generated at the center of the test area.

Referring to Tables 1 and 2, it can be seen that the electric field has a much greater than the magnetic field. Tables 1 and 2 illustrate examples in which the power signals respectively inputted to the first and fourth ports 30 and 60 are 1 W. For reference, those skilled in the art can easily obtain characteristics for dominant magnetic fields through the examples described above.

Referring to FIGS. 7, 8 and 9, the distribution (A) of electric fields and the distribution (B) of magnetic fields are shown in a system for generating dominant electric fields at 50 MHz.

It can be seen that the distribution of electric fields has a very uniform characteristic in the test area. Also, it can be seen that the impedance matching is less than +/−2 dB in the ⅓ area of the object to be tested. Also, it can be seen that the distribution of magnetic fields maintains a very low value at the center of the ⅓ area of the object to be tested.

Through such a structure, it is possible to generate standard near fields. That is, the characteristics of standard near fields can be easily obtained by inputting power signals having a phase difference of 180° and the same amplitude to the respective first and second ports 30 and 40 and terminating the third and fourth ports 50 and 60.

In this case, the distribution of electric fields has a characteristic very similar to that in FIG. 7. Since a change depending on a length is very low, it is possible to generate standard far fields with high field uniformity.

Figure 10:
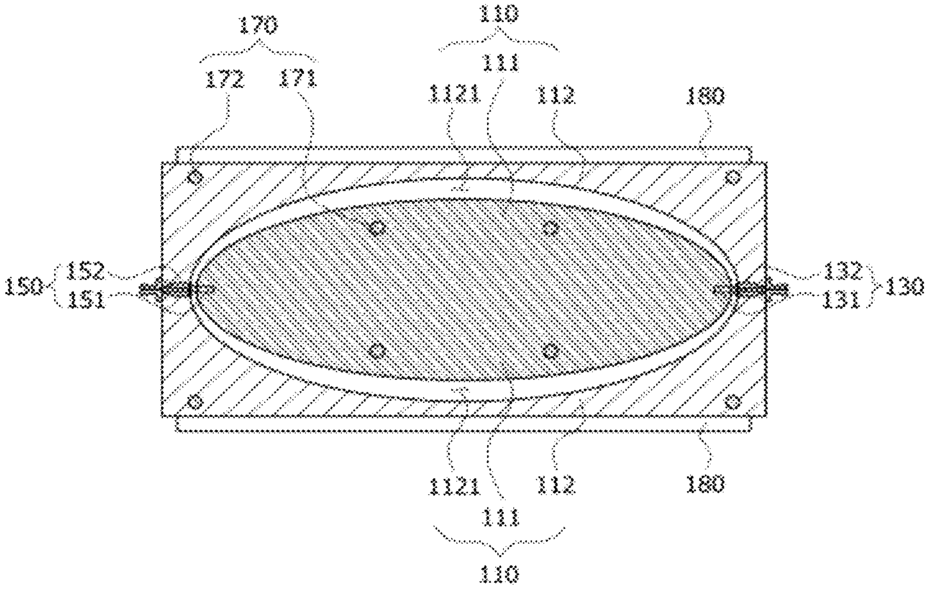
FIG. 10 is a plan cross-sectional view of a 4-port strip line cell for generating standard near fields according to another embodiment of the present invention.

FIG. 10 is a plan cross-sectional view of a 4-port strip line cell for generating standard near fields according to another embodiment of the present invention.

In the 4-port strip line cell according to the embodiment of the present invention, a first opening 1121 opened in an elliptical shape is formed in a first outer conductor 112 of an upper conductor 110, and a first inner conductor 111 formed in an elliptical shape is disposed horizontal to the first outer conductor 112 in the inside of the first opening 1121. The structure described above is identically applied to a lower conductor 120. Therefore, the configuration of the lower conductor

120 will be omitted. The upper and lower conductors 110 and 120 are mounted to be vertically spaced apart from each other.

As the first and second inner conductors 111 and 121 are formed in the elliptical shape, the impedance matching structure can be more easily implemented.

Like the aforementioned embodiment, first to fourth ports are symmetrically mounted to both ends of the upper and lower conductors 110 and 120. The first and third ports 130 and 140 are illustrated in FIG. 10.

In the 4-port strip line cell according to the embodiment of the present invention, descriptions of components identical to those in the aforementioned embodiment will be omitted.

Figure 11:
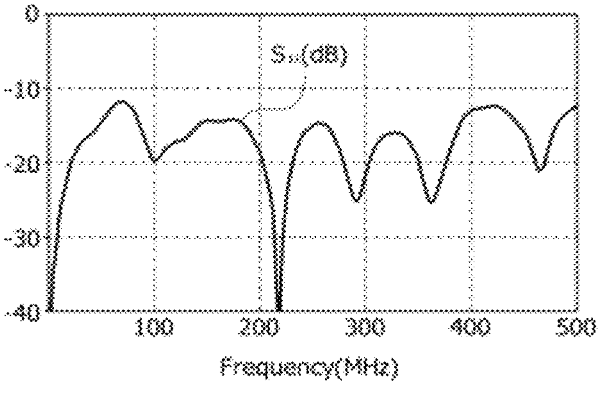
FIG. 11 is a graph illustrating an S11 parameter characteristic of the 4-port strip line cell according to the embodiment of the present invention.

FIG. 11 is a graph illustrating an S11 parameter characteristic of the 4-port strip line cell according to the embodiment of the present invention.

For reference, the 4-port strip line cell according to this embodiment of the present invention is designed so that each of the upper and lower conductors has an entire length of 150 cm and a width of 100 cm, and each of the first and second inner conductors has a minor axis of 80 cm and a major axis of 146 cm.

In this case, the S parameter characteristics maintain an impedance matching less than −12 dB up to 500 MHz as illustrated in FIG. 11, and it can be seen that the S parameter characteristics according to changes in frequency are smoothly connected thank to occurrence of a resonance frequency with a low Q-factor.

Figure 12:
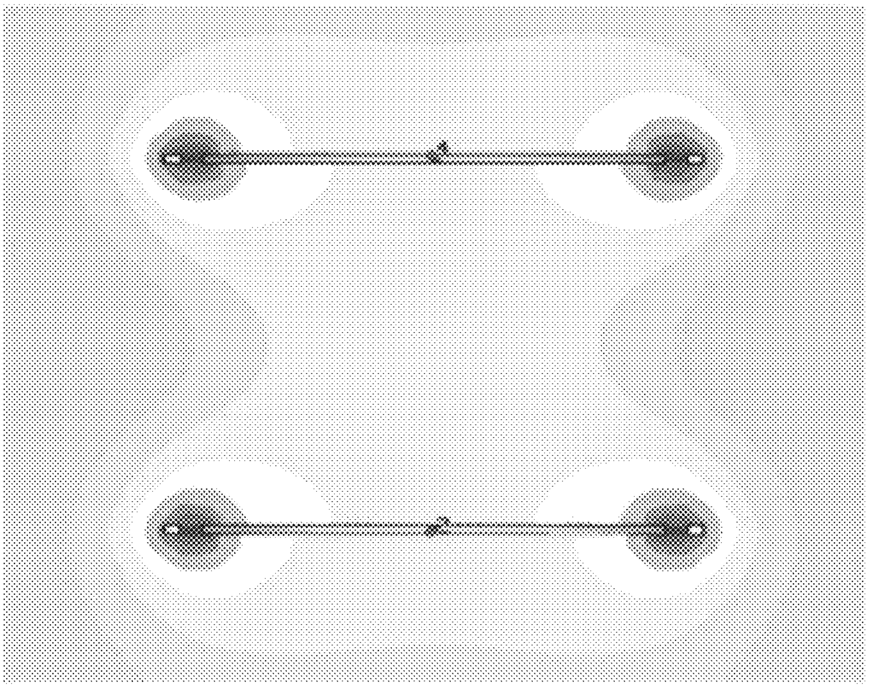
FIGS. 12(*a*) and 12(*b*) illustrate distributions of electric and magnetic fields on a side section of the 4-port strip line cell due to the generation of dominant electric fields according to the embodiment of the present invention.
Figure 12:
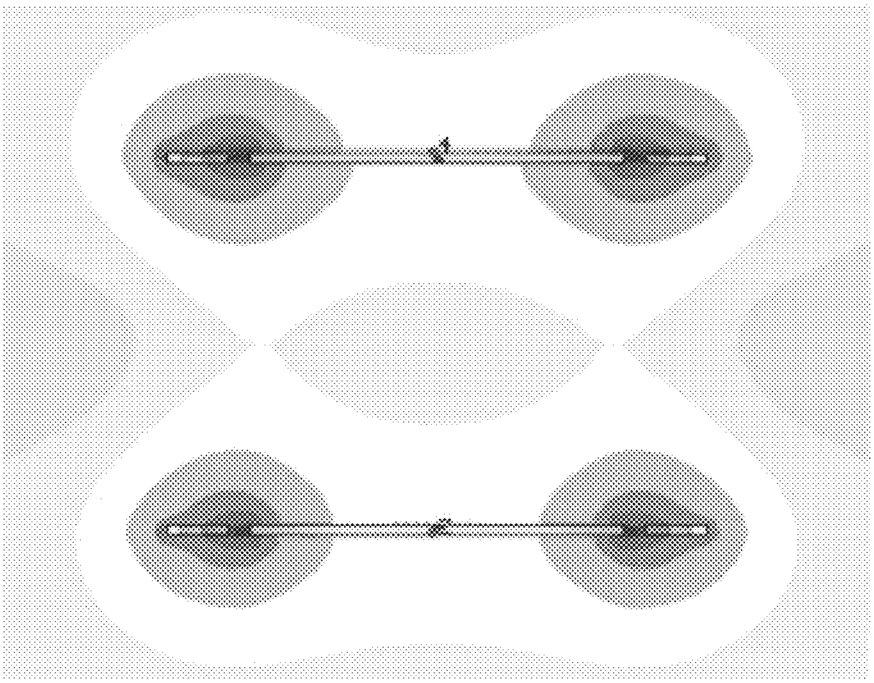
Figure 13:
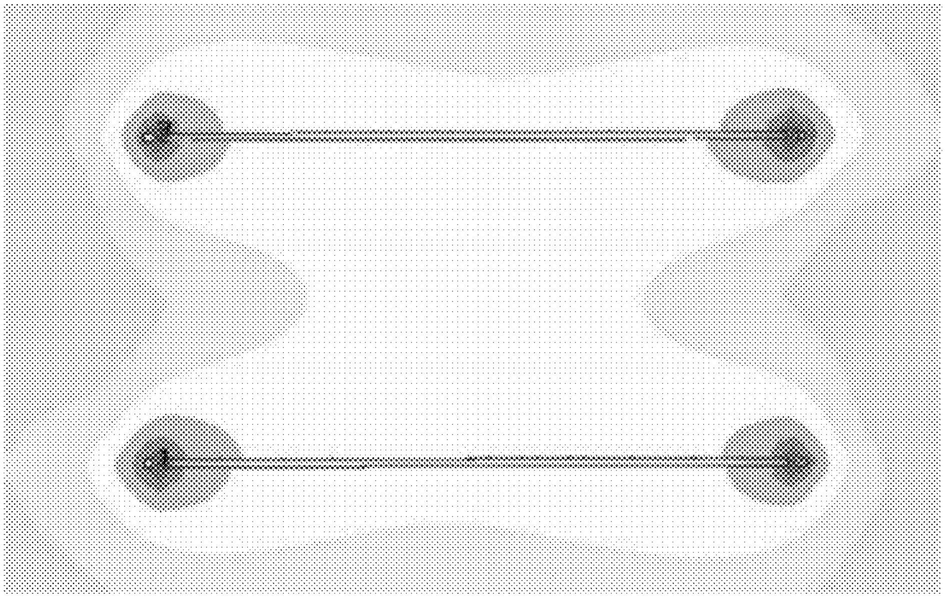
FIGS. 13(*a*) and 13(*b*) illustrate distributions of electric and magnetic fields on a front section of the 4-port strip line cell due to the generation of dominant electric fields according to the embodiment of the present invention.
Figure 13:
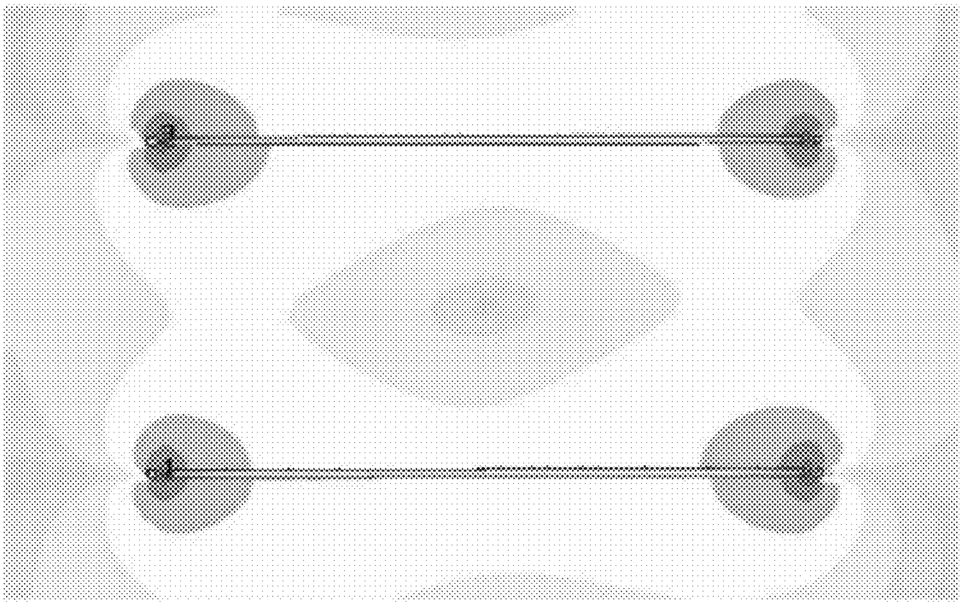
Figure 14:
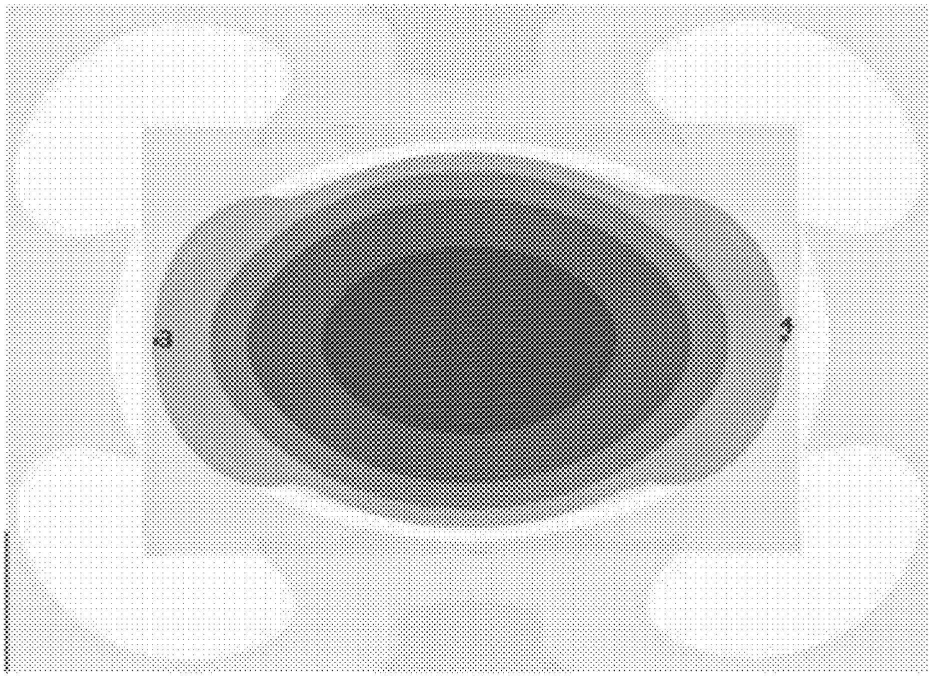
FIGS. 14(*a*) and 14(*b*) illustrate distributions of electric and magnetic fields on a plan section of the 4-port strip line cell due to the generation of dominant electric fields according to the embodiment of the present invention.
Figure 14:
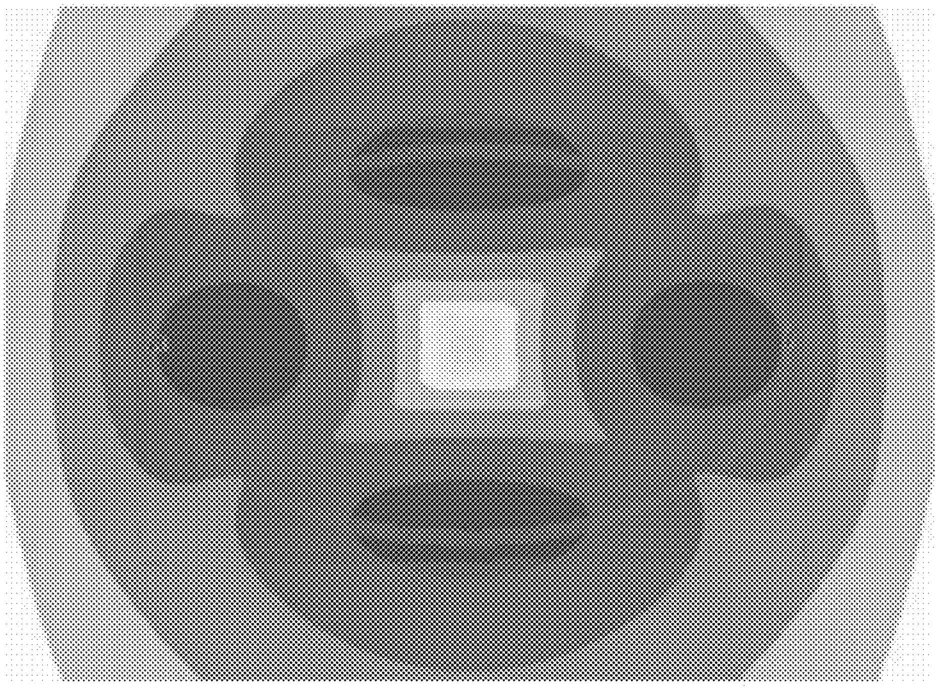

FIG. 12 illustrates distributions of electric and magnetic fields on a side section of the 4-port strip line cell due to the generation of dominant electric fields according to the embodiment of the present invention. FIG. 13 illustrates distributions of electric and magnetic fields on a front section of the 4-port strip line cell due to the generation of dominant electric fields according to the embodiment of the present invention. FIG. 14 illustrates distributions of electric and magnetic fields on a plan section of the 4-port strip line cell due to the generation of dominant electric fields according to the embodiment of the present invention.

In FIGS. 12 to 14, the distribution (A) of electric fields and the distribution (B) of magnetic fields are shown in a system for generating dominant electric fields at 50 MHz, and thus it can be seen that the distribution of electric fields has a very uniform characteristic in the test area. Also, it can be seen that the impedance matching is less than +/−2 dB in the ⅓ area of the object to be tested. Also, it can be seen that the distribution of magnetic fields maintains a very low value at the center of the ⅓ area of the object to be tested.

According to the present invention, a 4-port strip line cell is provided, so that it is possible to provide standard near fields with excellent quality. The distortion of signals is prevented by reducing the generation of corner waves, so that it is possible to generate electric waves not only in standard near fields with high uniformity but also in standard far fields.

The standard near fields with the high uniformity are generated, so that it is possible to provide accuracy in electromagnetic susceptibility tests, probe correction tests, sensitivity measurement of radio receivers and interference test for radio devices and to provide reproducibility of tests.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A 4-port strip line cell for generating standard near fields, comprising:

an upper conductor including an inner conductor and an outer conductor;

a third port configured to supply a power signal to the upper conductor;

a first port configured to terminate the upper conductor;

a lower conductor disposed to be spaced apart from the upper conductor;

a second port configured to be connected to the lower conductor and to supply a power signal in the opposite direction of the third port; and a fourth port configured to terminate the lower conductor, wherein the inner and outer conductors of the upper conductor are disposed in a coplanar manner.

2. The 4-port strip line cell of claim 1, wherein a distance between the upper and lower conductors is set to be a distance at which a maximum uniformity is formed.

3. The 4-port strip line cell of claim 1, wherein both the inner and outer conductors of the upper conductor are connected to the first port and to the third port.

4. The 4-port strip line cell of claim 1, wherein the lower conductor includes an inner conductor and an outer conductor that are disposed in the coplanar manner.

5. The 4-port strip line cell of claim 4, wherein both the inner and outer conductors of the lower conductor are connected to the second port and to the fourth port.

6. A 4-port strip line cell for generating standard near fields, comprising:

an upper conductor, including a first outer conductor configured to be formed in a flat plate shape and to have a first opening through which the first outer conductor is penetrated, and a first inner conductor formed in a flat plate shape and disposed horizontal to the first outer conductor in the inside of the first opening;

a third port configured to supply a power signal to the upper conductor;

a first port configured to terminate the upper conductor;

a lower conductor disposed to be spaced apart from the upper conductor;

a second port configured to be connected to the lower conductor and to supply a power signal in the opposite direction of the third port; and a fourth port configured to terminate the lower conductor.

7. The 4-port strip line cell of claim 6, wherein:

the third port has a third connector internal core and a third connecter external covering, and the first port has a first connector internal core and a first connector external covering; and the third connector internal core and first connector internal core are connected to both ends of the first inner conductor, respectively, and the third and first connector external coverings are connected to both ends of the first outer conductor, respectively.

8. The 4-port strip line cell of claim 6, wherein the first inner conductor and the first outer conductor are formed to have uniform characteristic impedances.

9. A 4-port strip line cell for generating standard near fields, comprising:

an upper conductor;

a third port configured to supply a power signal to the upper conductor;

a first port configured to terminate the upper conductor;

a lower conductor disposed to be spaced apart from the upper conductor;

a second port configured to be connected to the lower conductor and to supply a power signal in the opposite direction of the third port; and a fourth port configured to terminate the lower conductor, wherein the lower conductor comprises:

a second outer conductor configured to be formed in a flat plate shape and to have a second opening through which the second outer conductor is penetrated; and a second inner conductor formed in a flat plate shape and disposed horizontal to the second outer conductor in the inside of the second opening.

10. The 4-port strip line cell of claim 9, wherein:

the second port has a second connector internal core and a second connecter external covering, and the fourth port has a fourth connector internal core and a fourth connector external covering; and the second and fourth connector internal cores are connected to both ends of the second inner conductor, respectively, and the second and fourth connector external coverings are connected to both ends of the second outer conductor, respectively.

11. The 4-port strip line cell of claim 9, wherein the first inner conductor and the first outer conductor are formed to have uniform characteristic impedances.

12. A 4-port strip line cell for generating standard near fields, comprising:

an upper conductor including a first inner conductor and a first outer conductor;

a third port configured to supply a power signal to the upper conductor;

a first port configured to terminate the upper conductor;

a lower conductor which disposed to be spaced apart from the upper conductor, including a second inner conductor and a second outer conductor;

a second port configured to be connected to the lower conductor and to supply a power signal in the opposite direction of the third port; and a fourth port configured to terminate the lower conductor, wherein both sides of each of the first and second inner conductors are formed to have taper structures.

13. The 4-port strip line cell of claim 12, wherein the taper structures are formed in a straight line shape.

* * * * *